(12) United States Patent
Droz

(10) Patent No.: US 9,684,863 B2
(45) Date of Patent: Jun. 20, 2017

(54) ELECTRONIC CARD HAVING AN EXTERNAL CONNECTOR

(71) Applicant: NAGRAVISION S.A., Cheseaux-sur-Lausanne (CH)

(72) Inventor: Francois Droz, Corcelles (CH)

(73) Assignee: NAGRAVISION S.A., Cheseaux-sur-Lausanne (CH)

( * ) Notice: Subject to any disclaimer, the term of this patent is extended or adjusted under 35 U.S.C. 154(b) by 0 days.

(21) Appl. No.: 14/965,555

(22) Filed: Dec. 10, 2015

(65) Prior Publication Data

US 2016/0098628 A1    Apr. 7, 2016

Related U.S. Application Data

(62) Division of application No. 13/991,751, filed as application No. PCT/EP2011/072138 on Dec. 7, 2011, now Pat. No. 9,247,643.

(30) Foreign Application Priority Data

Dec. 7, 2010  (EP) ..................................... 10194068

(51) Int. Cl.
*H05K 1/14* (2006.01)
*G06K 19/077* (2006.01)
(Continued)

(52) U.S. Cl.
CPC ....... *G06K 19/0775* (2013.01); *G06K 19/077* (2013.01); *G06K 19/0723* (2013.01);
(Continued)

(58) Field of Classification Search
USPC .......... 361/679.01, 728, 729, 737, 748, 760, 361/761, 764, 803; 174/557, 50, 520,
(Continued)

(56) References Cited

U.S. PATENT DOCUMENTS 5,260,518 A    11/1993   Tanaka et al.
5,767,503 A     6/1998   Gloton
(Continued)

FOREIGN PATENT DOCUMENTS

DE    197 32 645    9/1998
DE    198 09 073    9/1999
(Continued)

OTHER PUBLICATIONS

International Search Report issued in related application PCT/EP2013/060167, completed Jul. 5, 2013 and mailed Jul. 15, 2013.
(Continued)

*Primary Examiner* — Hung S Bui
(74) *Attorney, Agent, or Firm* — Oblon, McClelland, Maier & Neustadt, L.L.P.

(57) ABSTRACT

A smart card is provided, including an external connector formed of an insulating support and a plurality of external metal contact pads arranged on an external face of the support, and a card body having a housing in which the external connector is arranged and includes an electronic unit and/or an antenna electrically connected to a plurality of internal metal contact pads arranged underneath the external connector and respectively aligned with the external pads. The external pads are respectively electrically connected to the internal pads by a plurality of metal parts, which are each at least partially formed by a solder material and which traverse the insulating support through respective apertures. The metal parts are respectively covered by the external pads, which close the apertures on the external face of the support, and respectively form connecting bridges between rear surfaces of the external pads and the internal pads.

18 Claims, 11 Drawing Sheets

(51) Int. Cl.
*H05K 1/11* (2006.01)
*G06K 19/07* (2006.01)

(52) U.S. Cl.
CPC . *G06K 19/07728* (2013.01); *G06K 19/07743* (2013.01); *G06K 19/07749* (2013.01); *G06K 19/07752* (2013.01); *G06K 19/07769* (2013.01); *H05K 1/112* (2013.01)

(58) Field of Classification Search
USPC ........................................................ 174/549
See application file for complete search history.

(56) References Cited

U.S. PATENT DOCUMENTS

| | | | |
|---|---|---|---|
| 5,975,420 A | 11/1999 | Gogami et al. | |
| 6,531,022 B1* | 3/2003 | Tsukahara | H01L 21/563 156/256 |
| 6,586,843 B2* | 7/2003 | Sterrett | H01L 24/11 174/257 |
| 6,639,299 B2* | 10/2003 | Aoki | H01L 21/56 257/528 |
| 7,247,508 B2* | 7/2007 | Higashitani | H01L 21/4853 257/E21.503 |
| 7,304,247 B2 | 12/2007 | Birgel et al. | |
| 8,164,003 B2* | 4/2012 | Tang | H01L 23/49811 174/257 |
| 2005/0150682 A1 | 7/2005 | Cohn et al. | |
| 2005/0285253 A1* | 12/2005 | Takashi | H01L 21/486 257/698 |
| 2007/0139977 A1 | 6/2007 | Desai et al. | |
| 2008/0206516 A1* | 8/2008 | Matsushima | H05K 1/0212 428/131 |
| 2009/0321126 A1 | 12/2009 | Chandrasekraran | |
| 2012/0112361 A1 | 5/2012 | Han et al. | |

FOREIGN PATENT DOCUMENTS

| | | |
|---|---|---|
| EP | 0 818 752 | 1/1998 |
| EP | 2 001 007 | 12/2008 |
| EP | 2 296 109 | 3/2011 |
| GB | 2 371 264 | 7/2002 |
| JP | 2009-182212 | 8/2009 |
| WO | 97/34247 | 9/1997 |
| WO | 03/017196 | 2/2003 |

OTHER PUBLICATIONS

International Search Report issued in corresponding application PCT/EP2011/072138, completed Jun. 27, 2012 and mailed Jul. 5, 2012.
Office Action issued in co-pending related U.S. Appl. No. 14/401,475 on Oct. 8, 2015.

\* cited by examiner

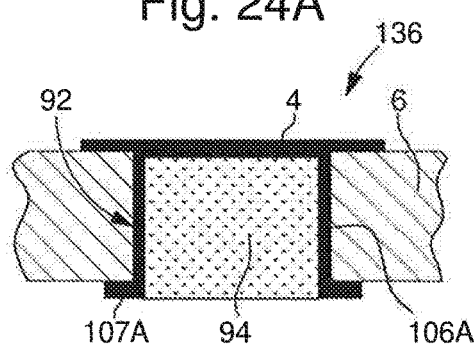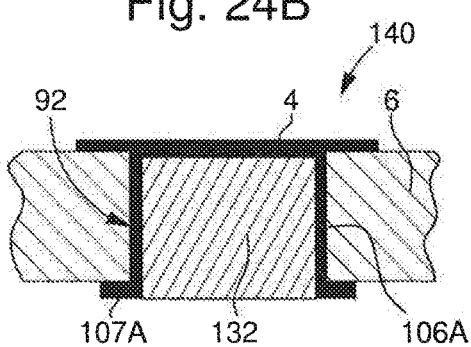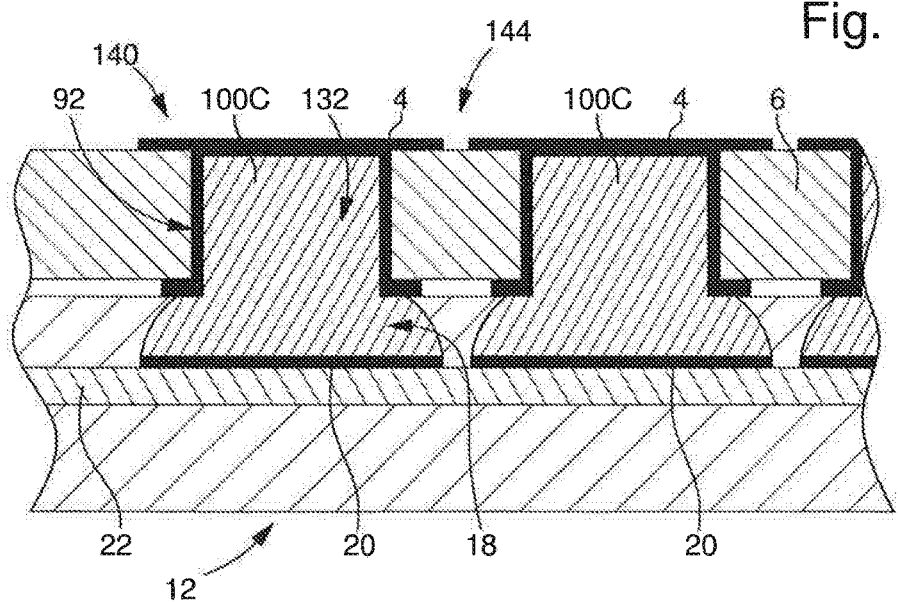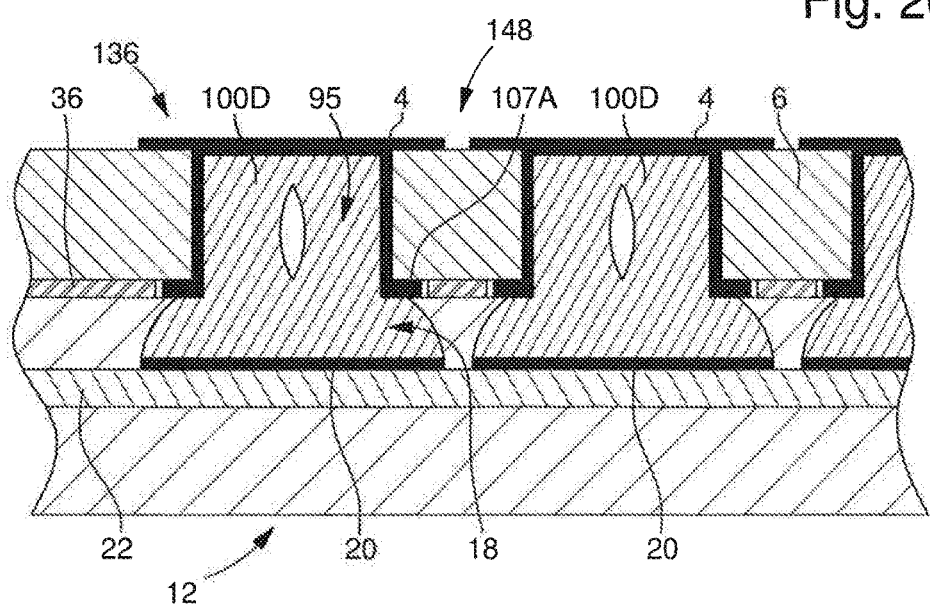

ELECTRONIC CARD HAVING AN EXTERNAL CONNECTOR

CROSS REFERENCE TO RELATED APPLICATIONS

This divisional application claims the benefit of priority under 35 U.S.C. §120 from prior U.S. patent application Ser. No. 13/991,751, filed Jun. 5, 2013, which is a U.S. national phase application under 35 U.S.C. §371 of International Application No. PCT/EP2011/072138, filed Dec. 7, 2011. This application is also based upon and claims the benefit of priority under 35 U.S.C. §119 from European Patent Application No. 10194068.2, filed Dec. 7, 2010. The entire contents of each of the above applications are incorporated herein by reference.

FIELD OF THE INVENTION

The present invention concerns the field of smart card or electronic cards, particularly bank cards, comprising an electronic unit and/or an antenna incorporated into the body of the card and an external connector arranged inside a cavity in the card body and having a plurality of contact pads arranged on an external face of an insulating support forming the connector. This plurality of contact pads is connected to a corresponding plurality of internal contact pads which are connected to said electronic unit and/or said antenna and which are visible in the cavity or which are electrically connected to a plurality of intermediate contact pads which are visible in the cavity.

BACKGROUND OF THE INVENTION

FIGS. 1A and 1B are schematic views of a conventional industrial method of fabricating smart cards of the aforementioned type. First of all, a connector 2 and a card body 12 are fabricated. Card body 12 has a cavity 14 for receiving connector 2. The connector includes external contact pads 4 arranged on an external face of support 6 and internal contact pads 8 arranged on the internal face of the support. External pads 4 are electrically connected to internal pads 8 by means known to those skilled in the art. Card body 12 includes a plurality of contact pads 16 intended to be connected to pads 8. Pads 16 are visible on a horizontal surface (parallel to the general plane of the card) of cavity 14. Each contact pad 16 is formed of a braze or solder 18, notably made of tin, deposited on an internal pad 20 of card body 12. Pads 20 are arranged at the surface of a support 22 associated with an electronic unit and/or an antenna incorporated in card body 12 and electrically connected to pads 20 via an electric circuit.

A film of conductive adhesive 10 and connector 2 are placed in cavity 14 of card body 12 and adhesive film 10 is arranged between the bottom of cavity 14 and connector 2. The connector is secured to card body 12 using a hot press device 26. FIG. 2 is a partial view of a card 28 obtained by the method of the background art described here. According to this conventional method, conductive adhesive 10 forms a layer between internal contact pads 8 and contact pads 16 located on the horizontal surface defining the bottom of cavity 14.

Various tests carried out on cards of the type shown in FIG. 2 and an analysis of defective cards returned by various users show that the electrical connections between external connector 2 and contact pads 16 visible in cavity 14 are unreliable. Electronic cards, notably bank cards, must be able to undergo various mechanical stresses given that users generally carry the cards either in their wallet or in a flexible card holder. The bending and twisting to which cards 28, and their pairs of contact pads bonded to each others are subjected may result in the contact pads peeling off locally or in gaps forming which then break the electrical connection. These electronic cards therefore have problems of longevity.

A smart card incorporating an antenna is known from DE Patent No. 197 32 645. This card comprises a recess in which there appear two first contact pads, respectively electrically connected to the two ends of the antenna, and an electronic module inserted into the recess. The module has two second contact pads electrically connected to the first two pads. Each first pad is defined by the top surface of a truncated metal bump. In order to establish the electrical connection between the first and second pads, there is deposited on the first or second pads either a conductive adhesive, or a solder or braze for soldering or brazing the two pads to each other. The connections obtained via the second alternative are more robust and electrically improved. However, soldering requires a relatively large heat supply to reach the soldering temperature. This document proposes supplying heat through the electronic module support, which is generally formed of an insulating material which is a poor thermal conductor, for example a reinforced resin or plastic. A large supply of heat to the support is liable to deform the support and even damage the electronic module.

A smart card of the aforementioned type is known from WO Patent No 97/34247 wherein the solder material provided between the contact pads is incorporated in an adhesive film. The solder material is incorporated, in particular, in apertures made in the adhesive film, which is then placed against the electronic module substrate so that the solder is superposed on the internal contact pads of the module. Finally, the adhesive is activated and the solder material is melted by supplying heat through the insulating support of the electronic module. Thus, there is the same problem as in the preceding document. Moreover, filling the apertures of an adhesive film with solder material before the film is assembled to the electronic module causes fabrication problems, since it is not easy to ensure that the solder material remains in the apertures in the adhesive film until it is assembled to the electronic module. Thus, a variant provides for the introduction of conductive particles into an adhesive film in the areas provided for the solders.

This document WO 97/34247 also proposes a particular embodiment shown in FIG. 2. In this case, a module is provided with first external contact pads, which are electrically connected to second contact pads, flush with a horizontal surface of the recess made in the card body, via solder filled channels which are formed through the insulating support of the electronic module and through the first external contact pads. This embodiment causes several problems. First of all, there is no guarantee that the channels will be filled with solder once the solder melts. In particular, if the solder introduced into the channels is initially in paste form to facilitate insertion into the channels, when it melts during assembly this causes a contraction of the solder and the material connection with the lateral surface of the holes in the external pads is not guaranteed, especially if the thickness of the external pads is relatively small. Next, the hole made in the external contact pad makes the card unattractive which is incompatible with a high quality card. This risk seems to be confirmed by the drawing in FIG. 2 of WO Patent No 97/34247 where the solder is below the level of the top surface of the external pads. There is therefore a real problem of reliability. Finally, these holes in the external pads cause a problem for card readers, which generally have pressure padds or feeler needles which are liable to be damaged when the card is inserted into or removed from the reader. Further, the melted and solidified solder (for example tin) is generally much softer than the metal forming the external pads (copper with a gold flash). Therefore, if the holes in the external pads are properly filled with solder, the pressure pads or needles of a card reader will spread the solder over the external pads when the card is inserted or removed. This has several negative consequences: First of all, the reader head is soiled with the solder. Secondly, if the quantity of solder spread is relatively large, a short circuit may even occur between two contact pads. Thirdly, the contact pads are also soiled with the spread solder; which is unattractive and unacceptable. In any event, it is clear that the diameter of the solder channels must necessarily be small so that the resulting holes in the external pads are as small as possible to limit the aforementioned problems. However, with small solder channels, it is difficult to provide the heat required to form a solder up to the second contact pads of the antenna.

SUMMARY OF THE INVENTION

It is an object of the present invention is to provide a smart card with an external connector which overcomes the drawbacks of the prior art yet provides efficient soldering or brazing between the external contact pads of the connector and the internal contact pads of the card body.

The present invention therefore concerns a smart card comprising:
- an external connector which includes an insulating support, defining an external face and an internal face opposite each other, and a plurality of external metal contact pads which are arranged on the external face of the insulating support;
- a card body having a recess in which the external connector is arranged;
- an electronic unit and/or an antenna incorporated in the card body and electrically connected to a plurality of internal metal contact pads which are arranged underneath the external connector and respectively aligned with the plurality of external metal contact pads in a perpendicular direction to the external face of the insulating support;

the plurality of external metal contact pads is respectively connected to the plurality of internal metal contact pads by a plurality of metal parts which are each formed at least partially by a solder or braze and which traverse said insulating support through respective apertures provided in the insulating support;

the smart card is characterized in that the plurality of metal parts are respectively covered by the plurality of external metal contact pads which close the apertures in the insulating support on the external face thereof. Said plurality of metal parts respectively form connecting bridges between the rear surfaces of the plurality of external metal contact pads and said plurality of internal metal contact pads.

In particular, the diameter of the metal parts in the insulating support apertures is sufficiently large to channel enough heat through said insulating support, when the smart card is fabricated, to melt the solder material located on or below the inner surface of the insulating support and thus to solder the connector to the plurality of internal metal contact pads.

According to a general embodiment, the diameter of the metal parts is more than 0.2 mm (200 µm) in the insulating support apertures. According to a preferred variant, the diameter of the metal parts is more than 0.5 mm (500 µm) in the insulating support apertures.

According to a preferred embodiment, said insulating support apertures are at least mostly filled with solder material.

The present invention also concerns an external connector intended to be housed in a cavity of a smart card whose body comprises an electronic unit and/or an antenna; said connector comprises an insulating support, having an external face and an internal face opposite each other and a plurality of apertures, and a plurality of external metal contact pads which are arranged on the external face of the insulating support. This connector is characterized in that the plurality of apertures is respectively covered by the plurality of external metal contact pads which close these apertures on the external face of the insulating support, and in that the plurality of apertures is at least mostly filled with a solder material.

As a result of these features of the smart card according to the invention and in particular of the external connector, the electrical connections between the external connector and the contact pads of the electronic unit and/or the antenna incorporated in the card body are achieved by means of robust solders made without damaging the electronic unit and without deforming the card body.

BRIEF DESCRIPTION OF THE DRAWINGS

The present invention will be described in the following detailed description, made with reference to the annexed drawings, given by way of non-limiting example, in which:

FIGS. 24A and 24B show two variants of a fifth embodiment of a connector according to the invention.

FIG. 25 is a partial cross-section of a fifth embodiment of a smart card according to the invention.

FIG. 26 is a partial cross-section of a sixth embodiment of a smart card according to the invention.

DETAILED DESCRIPTION OF THE INVENTION

Figure 1A:
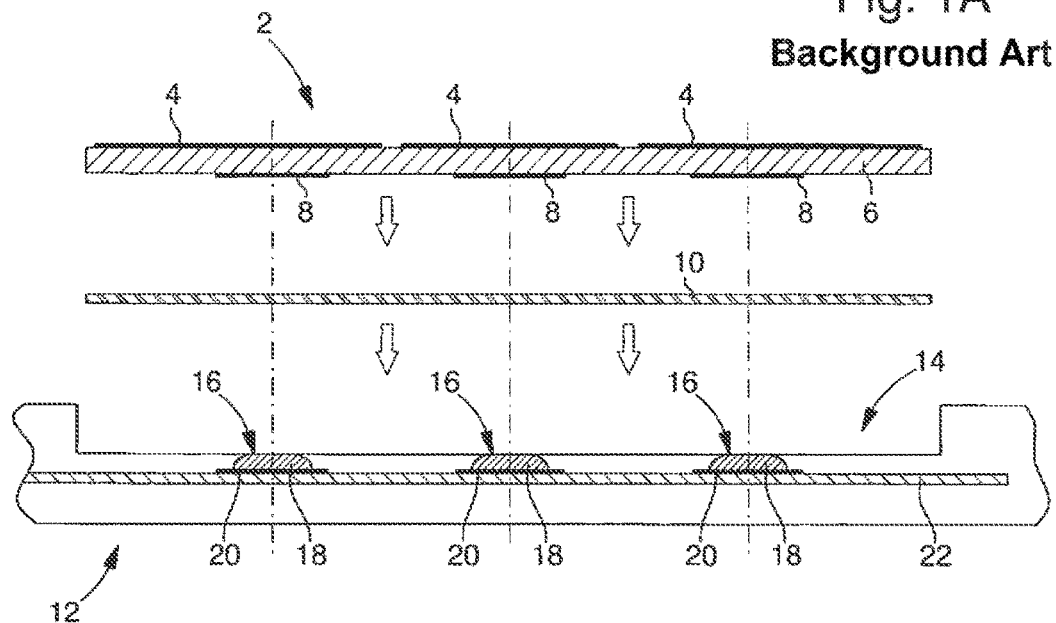
FIGS. 1A and 1B, already described, are schematic views of a conventional background art smart card fabrication method.
Figure 1B:
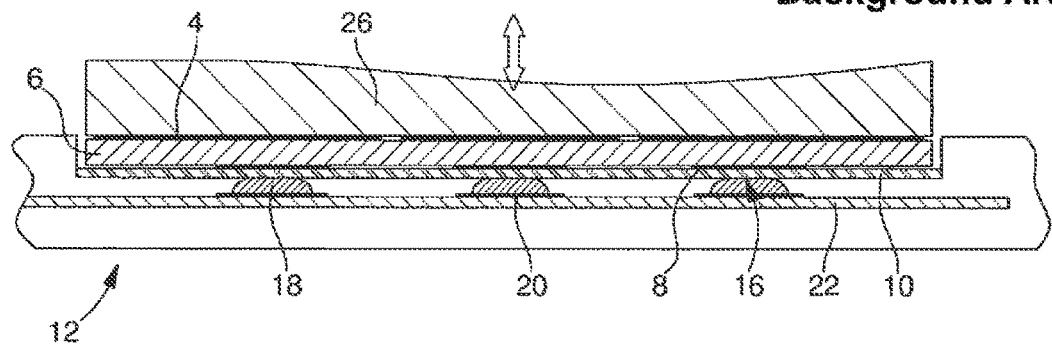
Figure 2:
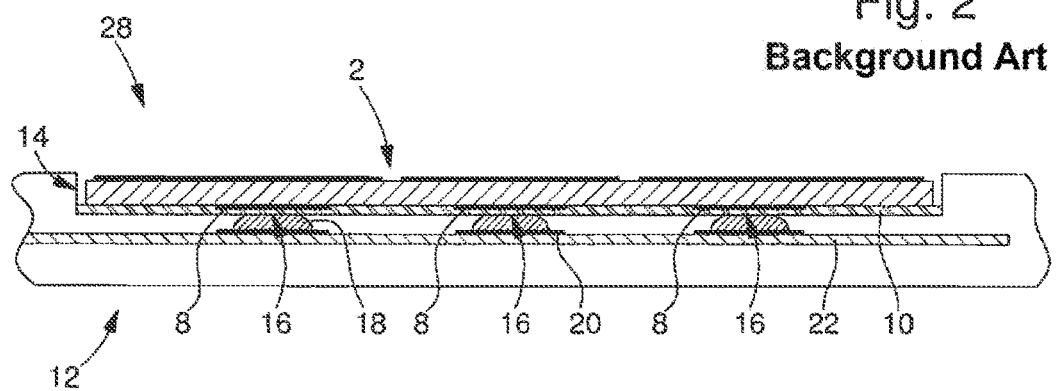
FIG. 2, already described, is a partial cross-section of a background art card.
Figure 3:
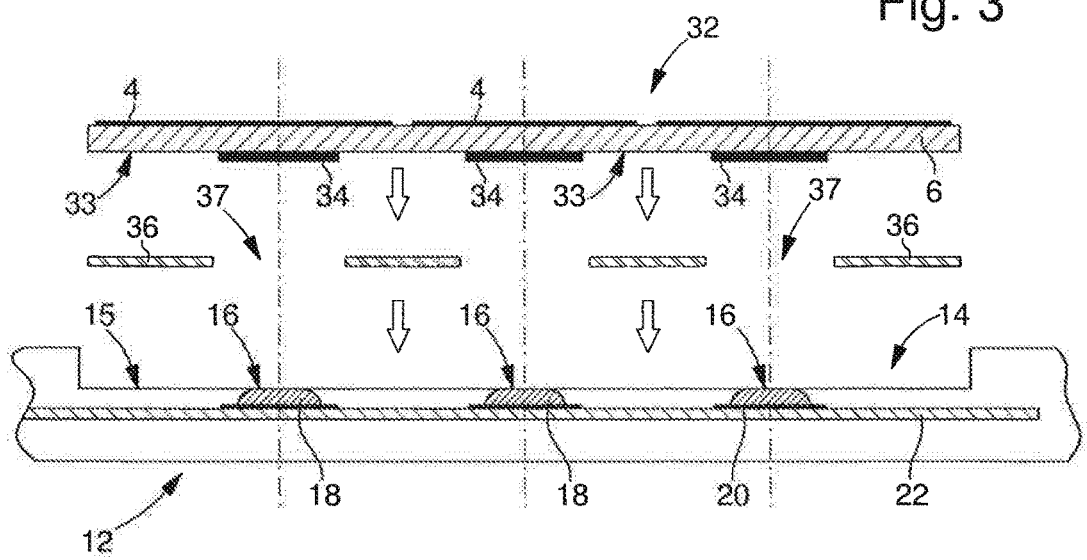
FIG. 3 is a schematic view of the various elements involved in a first implementation of an advantageous smart card fabrication method according to the invention.
Figure 4A:
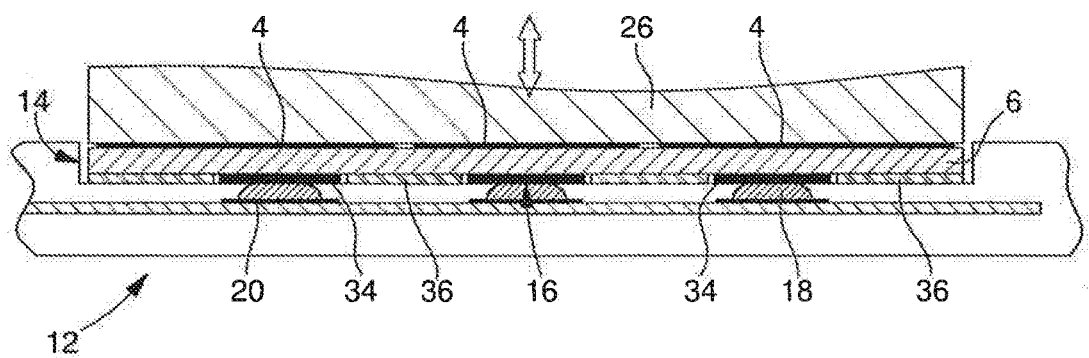
FIGS. 4A and 4B respectively show two steps of the first implementation of the fabrication method.
Figure 4B:
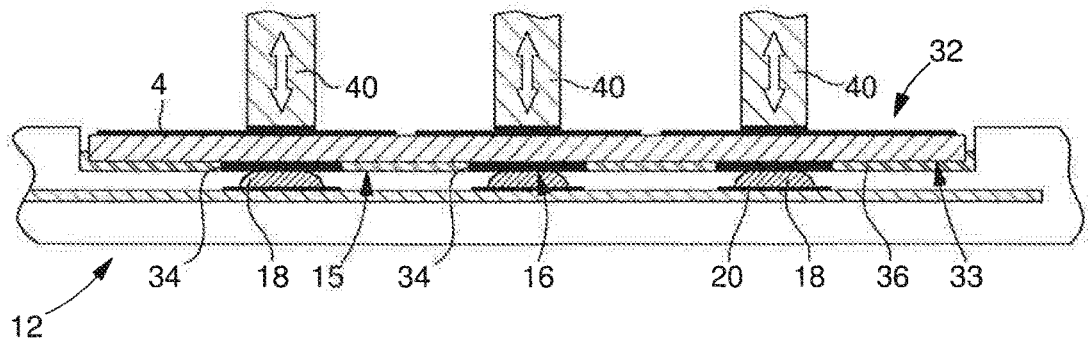

Referring to FIGS. 3, 4A and 4B, there will be described a first advantageous implementation made of a smart card fabrication method for easily producing smart cards according to the invention. The smart cards will be described below. Any references described above will not be described again in detail here. FIG. 3 shows three distinct elements involved in the fabrication of the smart card. These are external connector 32, pierced adhesive film 36 and card body 12 which is similar to the body described above.

External connector 32 includes a support 6 on the external face of which are arranged external contact pads 4. A first plurality of internal contact pads 34 is arranged on the internal face 33 of support 6. Pads 34 are formed of metal contacts whose thickness is substantially equal to the thickness of adhesive film 36, for example between 30 and 80 microns (30-80 μm). This hot melt adhesive film has a plurality of apertures 37 whose layout matches the first plurality of internal contact pads 34 of external connector 32. Card body 12, which incorporates at least one electronic unit and/or an antenna (not shown in the Figures) has a cavity 14 provided for connector 32. A second plurality of contact pads 16, electrically connected to said electronic unit and/or said antenna incorporated in the card body, is visible on the surface 15 of cavity 14.

In a variant, a pierced adhesive film 36, which is arranged on surface 15 of cavity 14, is provided for assembling connector 32 to card body 12. Next, external connector 32 is placed in cavity 14 with its inner face 33 abutting against adhesive film 36. The first and second pluralities of contact pads 34 and 16 are arranged to be located opposite each other when connector 32 is inserted into cavity 14. Adhesive film 36 is cut to substantially the dimensions of cavity 14 which are substantially adjusted to those of support 6. The apertures 37 in adhesive film 36 are made so that they are aligned with the pairs of corresponding contact pads 16 and 34 located opposite each other. The dimensions of apertures 37 are equal to or slightly greater than those of corresponding internal contact pads 34. In this variant, connector 32 and adhesive film 36 are placed separately in cavity 14 and the first plurality of contact pads 34 is inserted into apertures 37 in the adhesive film. As a result of the arrangement of the connector and the adhesive film, the internal contact pads 34 are then either abutting against contact pads 16 of card body 12, or located in very close proximity thereto. Using a hot press device 26, as shown in FIG. 4A, the external connector 32 is then bonded to surface 15 of cavity 14. Preferably, sufficient pressure is exerted on connector 32 to ensure physical contact between metal contacts 34 and the corresponding pads 16. Cavity 14 thus defines a housing for connector 32, which adheres to surface 15 of said cavity by means of adhesive 36 positioned between surface 15 and the inner face 33 of connector 32.

In another variant, the adhesive film is arranged against internal connector face 33 before the connector is placed in the housing in the card body. In this preliminary step, it must be ensured that the adhesive film adheres sufficiently to the connector for it to remain secured thereto during handling until the connector is inserted in the housing.

It is to be noted here that in the variants described, the adhesive is provided in the form of a hot melt adhesive film. However, in other variants which are not described, the adhesive may be provided in other ways, particularly in the form of a viscous liquid or paste deposited in certain areas of inner face 33 of support 6 or surface 15 defined by the bottom of cavity 14. However, these latter variants are complex given that the adhesive is not intended to cover thick metal contacts 34.

According to a particular variant, internal contact pads 34 of connector 32 are formed by galvanic deposition on the metal pads of a printed circuit on internal connector face 33. According to another variant, the internal contact pads are achieved by screen printing or by a similar technology for accurately depositing a solder material in the form of a paste with a determined thickness corresponding to the thickness of the adhesive film ("solder material" means a metal or metal paste which melts at a temperature suitable for soldering or brazing using metal material, preferably lower than 1000° C.). The connector is advantageously placed in a furnace to dry the solder paste (for example a tin paste) so that it hardens or to melt the paste in a controlled manner so that, after solidification, compact metal internal contact pads (with no air and/or additional liquid) are obtained. Finally, in another variant, the internal contact pads 34 are achieved by a device for dispensing solder in doses, in paste or preferably liquid form (molten metal), in a localised manner in specific areas (in particular on the initial metal pads of a printed circuit). In the case of a solder paste, the surface of the resulting pads is not necessarily flat. Here too, the connector is advantageously placed in a furnace to dry the paste so that it hardens or melts in a controlled manner. In any case, care will be taken that the volume of solder material dispensed is substantially equal to the volume defined by the aperture made in the adhesive film when the connector is placed in the card body cavity.

In another variant which is not shown, the solder material provided to compensate for the height of the adhesive film is not placed on inner connector face 33 but on pads 16 which are visible in the card body cavity. In this case too, the amount of solder material deposited on each pad 16 is determined so that its volume substantially corresponds to or is slightly less than the volume of the corresponding adhesive film aperture 37. Where the solder material is provided in paste form, the card body is advantageously placed in a furnace to dry the paste so that it hardens or melts in a controlled manner. The height of the contact pads on the inner connector face in the present variant is low (for example between 5 and 10 microns, which is the conventional height of a printed circuit).

In the variant described in FIGS. 3 and 4A/4B, the second plurality of contact pads 16 is formed by a solder 18 deposited on a third plurality of contact pads 20 arranged at the surface of a support 22 associated with the electronic unit and/or antenna and incorporated in card body 12.

Where the external contact pads 34 comprise a solder or in the aforementioned alternative where solder material is deposited on pads 16 of the card body, the contact pads at the bottom of the cavity 14 may be formed directly by the third plurality of contact pads 20, which then define pads 16 flush with cavity surface 15. These pads 20 may have a certain thickness obtained in particular by a relatively thick galvanic deposition. Each pad 16 may, in another variant, be formed by a stud or metal tongue, for example made of copper, arranged on printed circuit pad 20.

Once the connector 32 is bonded in cavity 14 by means of a hot press 26, adhesive 36 surrounds the thick metal contacts 34. After the bonding step, these metal contacts are arranged against contact pads 16. As shown in FIG. 4B, heat is then provided through connector 32 to solder the first plurality of contact pads 34 to the second plurality of contact pads 16. This soldering is easily achieved given the presence of solder 18 and/or a solder at least partially forming thick metal contacts 34. The heat for soldering is preferably provided locally by means of the soldering thermodes 40 of a soldering device configured to simultaneously solder all of the connections provided. This localised supply of heat is carried out to avoid damaging card body 12, in particular to avoid deforming the card body.

Figure 5:
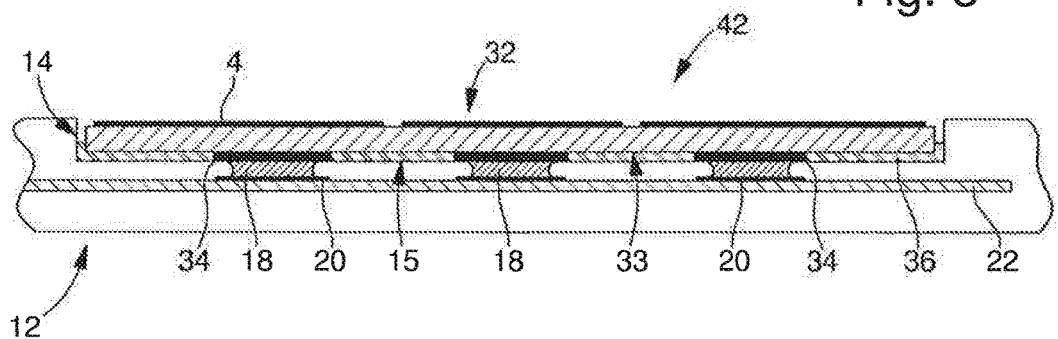
FIG. 5 is a partial cross-section of a smart card obtained via the first implementation of the fabrication method.

The fabrication method described above produces the smart card 42 partially shown in cross-section in FIG. 5. External contact pads 4 are electrically connected to thick metal contacts 34. Thus, external connector 32 allows a card reader with resistive contacts to access the electronic unit incorporated in card 42. The solder between each internal contact pad of connector 32 and the corresponding contact pad 20 arranged at the surface of support 22 guarantees a robust electrical connection between the external connector and the electronic unit and/or the antenna incorporated in body 12 of card 42. This solder ensures a strong connection between contact pads 34 and contact pads 20.

Figure 6:
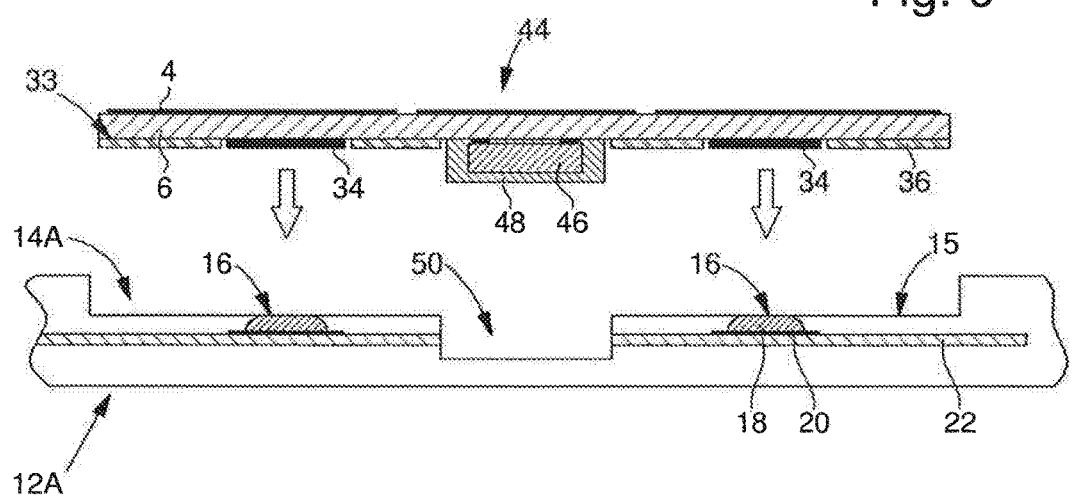
FIG. 6 shows a step of a variant of the first implementation of the fabrication method.
Figure 7:
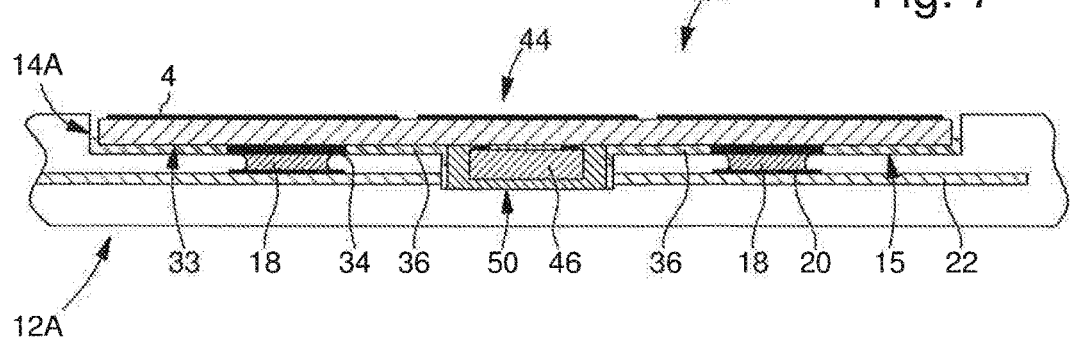
FIG. 7 is a partial view of a card obtained via the variant of the method according to FIG. 6.

FIG. 6 shows a variant of the first embodiment of the method described above and FIG. 7 shows a partial cross-section of the smart card 52 resulting from this variant. Any references described above will not be described again in detail here. This variant concerns an external connector 44 which has an electronic circuit on its inner face 33, particularly an integrated circuit 46, coated in a resin 48. This external connector 44 therefore defines an electronic module of the type used in bank cards with external resistive contacts. In particular, the variant embodiment of FIGS. 6 and 7 concern a card known as a "dual interface" card, i.e. a smart card able to communicate with a resistive contact reader and also with a contactless reader by means of an antenna arranged in card body 12A. Thus, for example, the two contact pads 15 visible at the surface 15 of cavity 14A define two contact pads of an antenna arranged on support 22 and incorporated in card body 12A. Cavity 14A has a bottom recess 50 of substantially the dimensions of coating 48 for housing integrated circuit 46 and protective coating 48. This recess 50 may traverse support 22 as shown in FIGS. 6 and 7. Internal contact pads 34 of connector 44 are made in the same manner as those of the connector 32 described above.

Figure 8A:
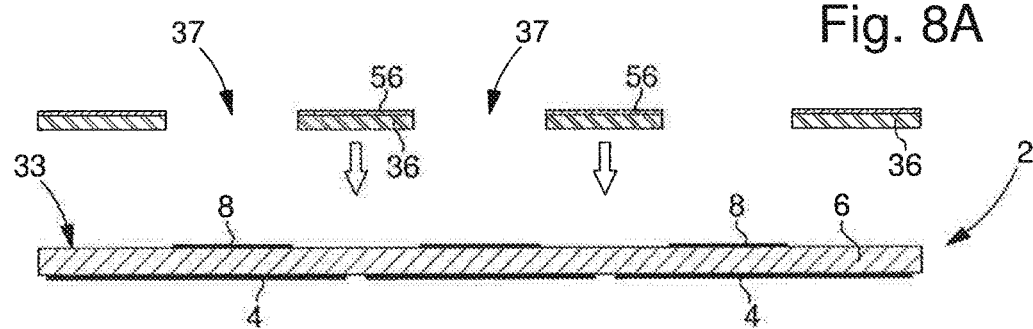
FIGS. 8A to 8E are schematic views of the various steps of a second implementation of an advantageous smart card fabrication method according to the invention.
Figure 8B:
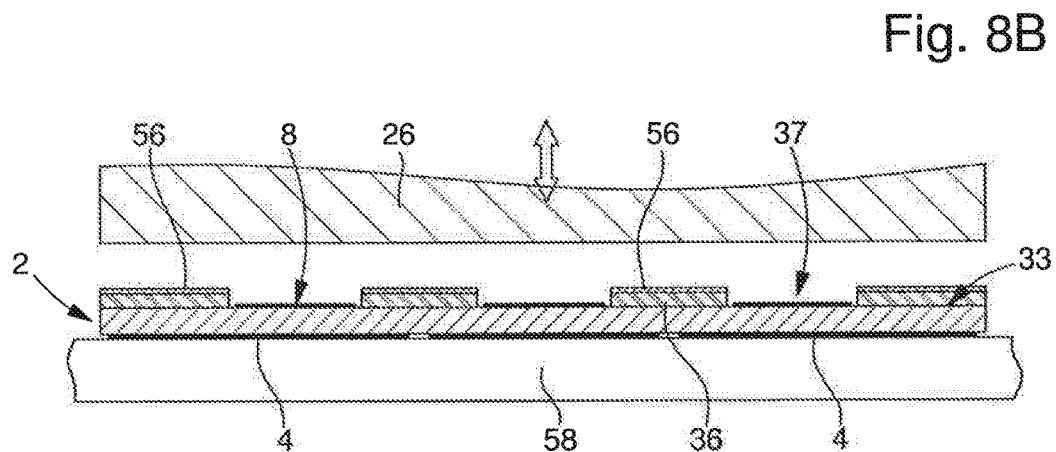

Referring to FIGS. 8A to 8E, there will be described below a second advantageous implementation of a smart card fabrication method for easily producing smart cards according to the invention. The smart cards will be described below. Any references described above will not be described again in detail here. In a first step, a pierced adhesive film 36 is placed on the inner face 33 of an external connector 2. The film has a plurality of apertures 37 corresponding to the plurality of internal contact pads 8 arranged on inner face 33. Pierced adhesive film 36 is provided with a detachable sheet 56 (siliconized paper) which acts as a support for the film. The detachable sheet adheres slightly to adhesive film 36. Adhesive film 36 is placed on inner face 33 so that internal contact pads 8 are located in the corresponding adhesive film apertures 37. In the next step, as shown in FIG. 8B, adhesive film 36 is applied against inner face 33 using a hot press 26 so that adhesive film 36 adheres properly to support 6 of connector 2. Sheet 56 is then removed.

Figure 8C:
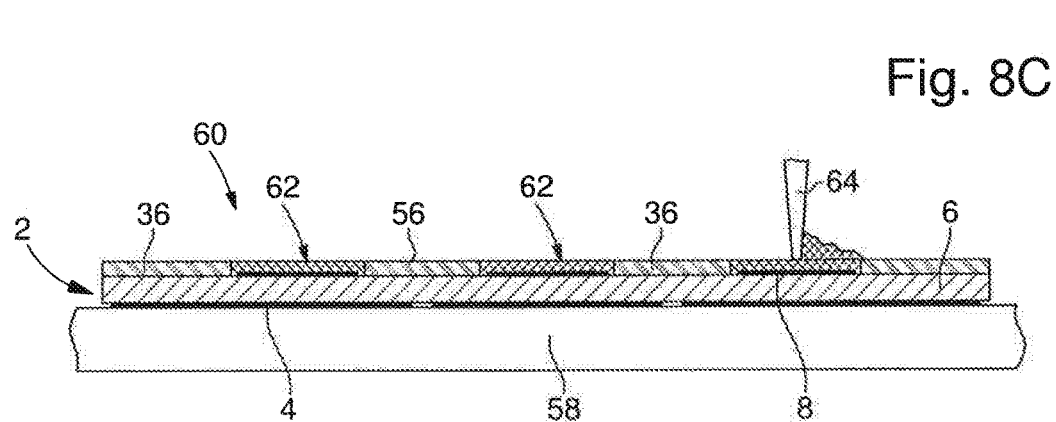

In the next step shown schematically in FIG. 8C, a solder material 62, particularly a tin paste, is placed in apertures 37 in adhesive film 36. This solder material slightly overfills the apertures and then, using a blade 64, the surplus is removed and the external surfaces of solder material 62 are flattened to substantially the external surface level of the adhesive film. In a particular variant, the solder material is dispensed by a device with at least one nozzle. The device deposits a slightly greater amount of solder material in each aperture 37 than the volume defined by the aperture. Once spread into the adhesive film apertures, the metal paste can then be dried in a furnace. Since the adhesive film is already applied against the connector, care will be taken to limit the drying temperature, for example to between 50° and 70°.

External connector 60 is obtained once the solder material has been placed in the apertures in adhesive film 36. It includes a substrate 6, on a first face of which are arranged external contact pads 4. Contact pads 8 and hot melt film 36, whose apertures are aligned with contact pads 8, are arranged on the second face of support 6. A solder material 62, notably a tin paste, is deposited above contact pads 8, in the apertures in adhesive film 36.

Figure 8D:
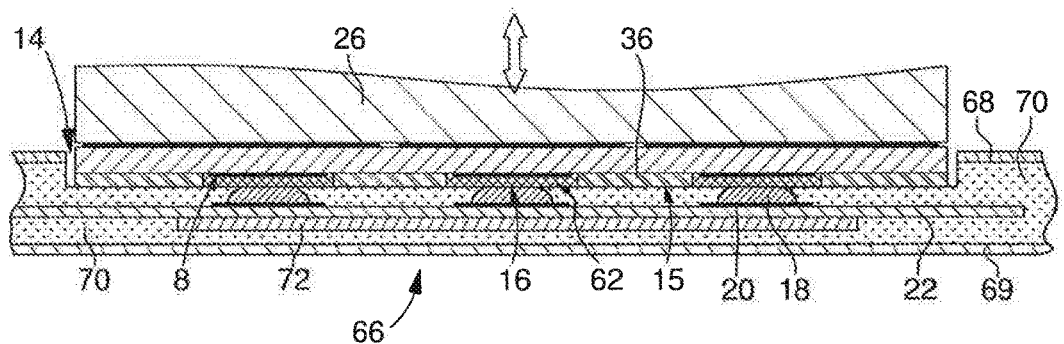

In a subsequent step of the second implementation of the fabrication method, the external connector 60 is placed in a cavity 14 in card body 66. As in the first embodiment described above, contact pads 16, formed by a solder material 18 deposited on internal contact pads 20 of card body 66, are visible at the bottom surface of the cavity. The variants described above for making contact pads 16 may be also be used here. It will be noted that, in all cases, the solder material necessary for a proper solder is placed in the adhesive film apertures. The plurality of contact pads 16 is arranged to be located opposite the plurality of internal contact pads 8 of connector 60. Solder material 62 deposited in the apertures of adhesive film 36 directly touches contact pads 16 of card body 66. As shown in FIG. 8D, a hot press 26 is used to activate the adhesive film so as to secure connector 60 to card body 66.

Figure 8E:
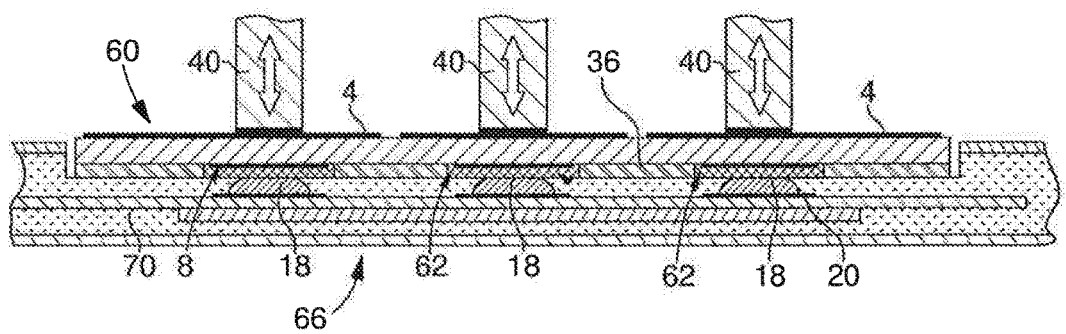
Figure 9:
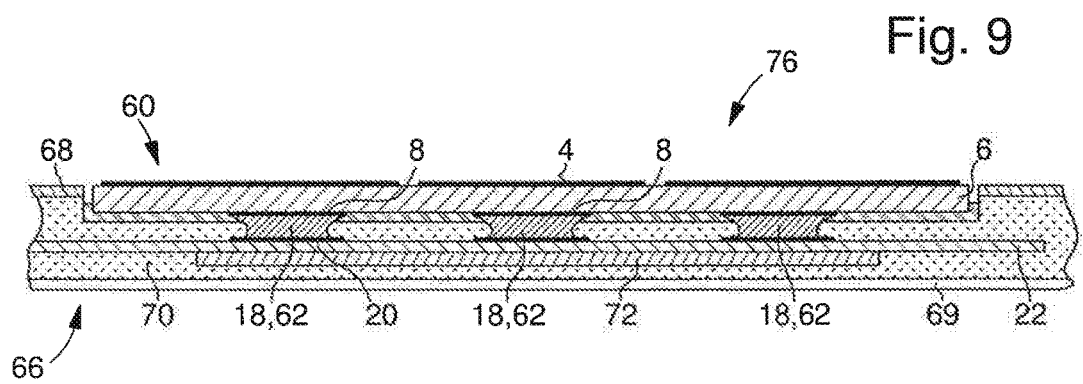
FIG. 9 is a partial cross-section of a card obtained via the second implementation of the fabrication method.

Next, the hot press is removed and, in the variant described here, a soldering device including a plurality of thermodes 40 is used to perform the soldering step shown schematically in FIG. 8E. It will be noted that thermodes 40 are applied against areas of external contact pads 4 and respectively aligned with the corresponding pairs of contact pads 8 and 20 between which solder materials 18 and 62 are superposed on each other. Solder material 62 locally deposited in the adhesive film apertures define an intermediate layer between the two contact pads to compensate for the thickness of adhesive film 36, which is located between the bottom surface of the card body cavity and the inner face of connector 60 once the connector is secured to the card body. Thermodes 40 provide sufficient heat locally to melt solder material 62 and preferably at least partially melt solder material 18 between the corresponding pairs of contact pads. The smart card partially shown in cross-section in FIG. 9 is obtained after this soldering operation.

In the variant described above, the external connector is made by a hot press 26. The internal contact pads of the connector are soldered to the (?) contact pads of the card body in a subsequent step using a specific soldering device. In a variant implementation of the fabrication method, these two steps are combined using a device able to supply both the heat necessary for bonding, which is carried out for example between 100 and 150° C., and also to supply sufficient heat locally at the internal contact pads of the connector to perform the soldering, for example at a temperature of between 500 and 600° C.

Smart card 76, obtained via the second implementation of the fabrication method, is characterized by the connection of the plurality of internal contact pads 8 to the plurality of corresponding contact pads 20 by means of solders formed by melted solder materials 18 and 62 amalgamated to form rigid metal bridges between the pairs of corresponding contact pads. Solder materials 18 and 62 are preferably formed of tin; but in other variants, the soldering can also be performed, for example, with copper.

Card body 66 is formed of an intermediate resin layer 70 located between two external layers 68 and 69. Support 22, at the surface of which contact pads 22 and braze spots 18 are arranged, is coated with resin 70. This resin 70 also coats other elements of the fabricated card, particularly the electronic unit and/or the antenna (not shown) incorporated in the smart card. According to a preferred variant, a solid layer 72 is provided on the back of support 22. The function of layer 72 is to position the top of support 22 and thus solder bumps 18 in the intermediate resin layer. This ensures that contact pads 16, defined by the truncated solder bumps, are flush with the bottom surface of the cavity when the cavity is machined. Indeed, it is clear that the depth of the cavity is defined by the thickness of the external connector. Where fabrication is achieved using a resin 70 provided in a non-solid state, particularly a viscous liquid or paste, it was observed that substrate 22 tends to move down into the resin and then remains relatively close to the solid bottom layer 69. This causes a problem particularly for the fabrication of complex cards using non-solid resins to coat the various elements and units provided. As a result of the additional solid layer 72 provided on the back of support 22, it is possible to position support 22, and thus the solder bumps rising out of contact pads 20, relatively precisely in the thickness of the resin layer.

Within the scope of the present invention, a method is therefore provided for fabricating a smart card comprising at least one electronic unit and/or antenna incorporated in the card body and external contact pads. The method includes the following steps:

fabricating an external connector having said external contact pads on its external face and a plurality of internal contact pads on its inner face, opposite the external face;

fabricating the card body with a cavity for the connector, with the electronic unit and/or the antenna being electrically connected to a second plurality of contact pads visible on a surface of the card body cavity;

placing the connector and an adhesive in the cavity, with the first and second pluralities of contact pads being arranged to be located opposite each other when the connector is inserted into the cavity;

supplying heat through the connector to solder the first plurality of contact pads to the second plurality of contact pads, the contact pads of the first plurality and/or the contact pads of the second plurality being configured and/or an intermediate solder material being deposited locally on the first and/or the second plurality of contact pads to compensate for the thickness of the adhesive located between the cavity surface and the inner connector face once the connector is secured to the card body.

Figure 10:
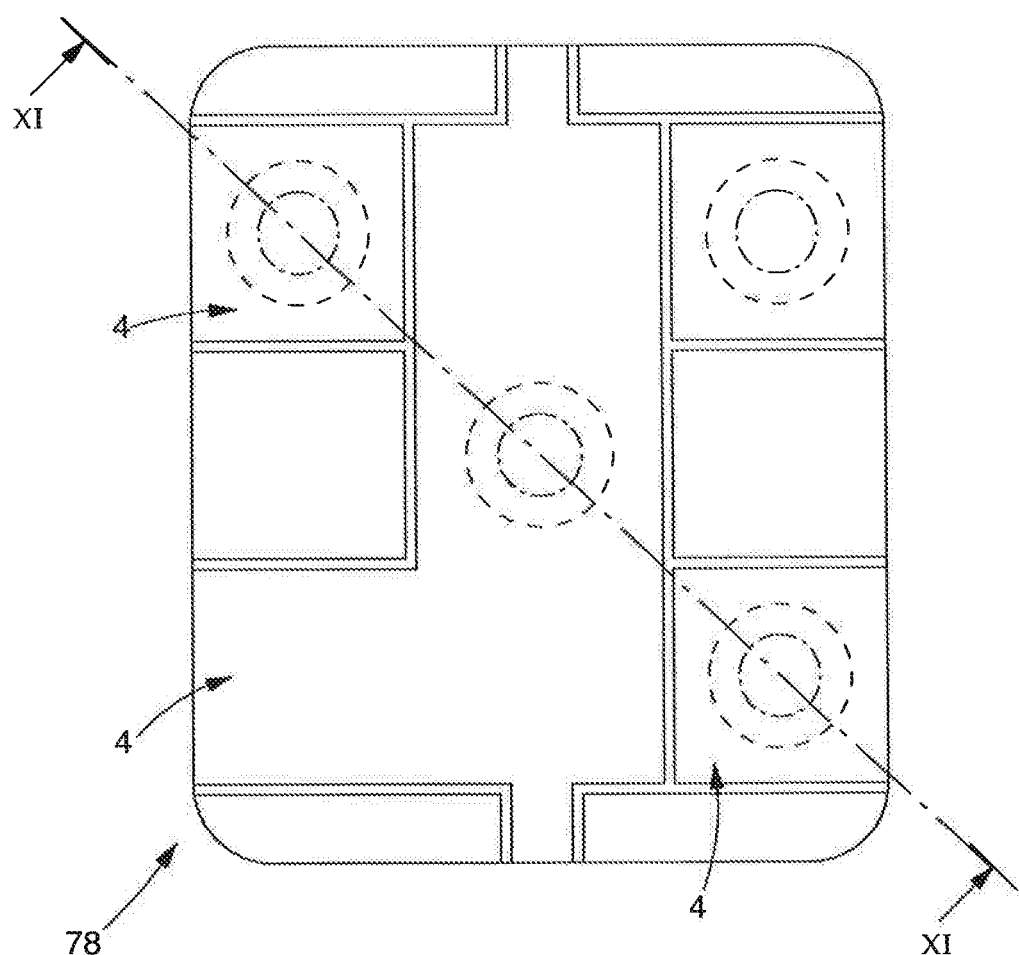
FIG. 10 is a top view of a first embodiment of an external connector according to the invention.
Figure 11:
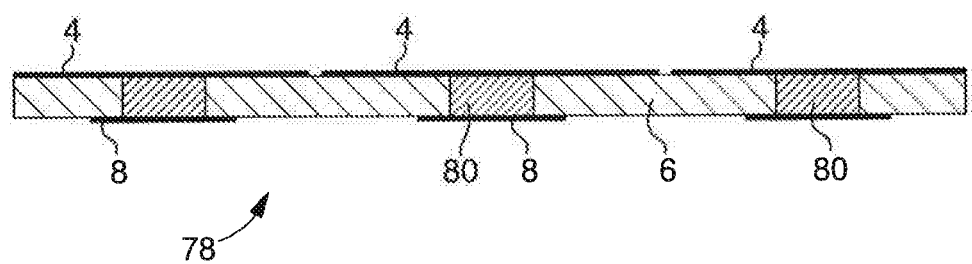
FIG. 11 is a schematic cross-section, along the line XI-XI, of the external connector of FIG. 10.

FIGS. 10 and 11 are schematic views of a first embodiment of an external connector according to the invention. In a conventional manner, this connector 78 has external contact pads 4 on the external face of support 6 and internal contact pads 8 on the internal face of support 6. According to the invention, metal vias 80 of relatively large diameter are provided between external contact pads 4 and internal contact pads 8. These metal vias are used first of all for the electrical connection of external pads 4 to internal pads 8. Next, vias 80 superposed on internal contact pads 8 facilitate the step of soldering the contact pads to the corresponding card body contact pads, as described above. Indeed, substrate 6 is formed of an insulating material which is generally a poor conductor of heat. However, metal vias 80 conduct heat very well. Thus, the heat supplied by means of the specific soldering device described above is channelled by vias 80 towards internal contact pads 8 and the solder material provided on or underneath said pads 8, to solder pads 8 to the internal contact pads of the card body. As a result of the arrangement of vias 80, as shown schematically in FIG. 11, it is therefore possible to supply less heat during the soldering step and thus to avoid any local deformation of the card body due to the heat, which generates high temperatures for the plastic materials or resin forming the card body.

Figure 12:
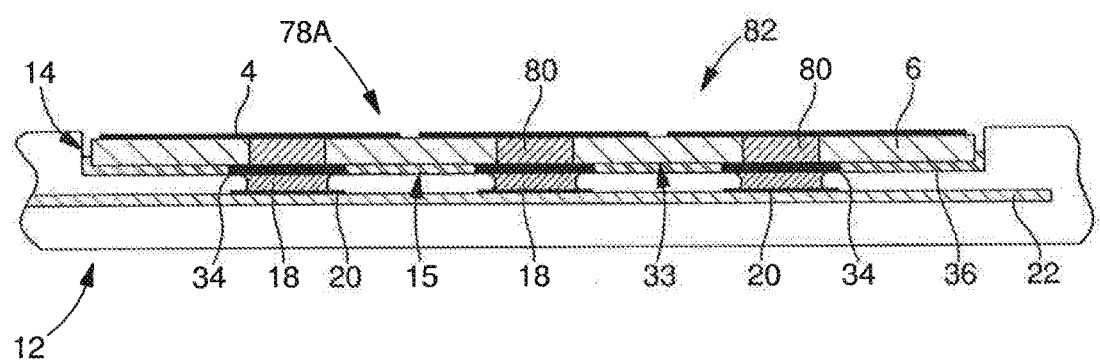
FIG. 12 is a partial view of a first embodiment of a smart card according to the invention.
Figure 13:
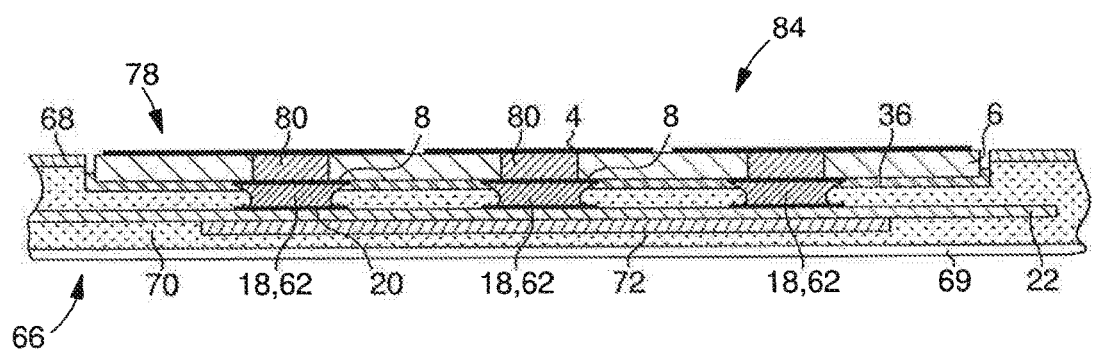
FIG. 13 is a partial cross-section of a second embodiment of a smart card according to the invention.

FIG. 12 shows a schematic cross-section of a first embodiment of a smart card 82 according to the invention. This card includes a connector 78A according to the invention, similar to connector 78 described above and having a thick contact pad 34. It is obtained via the first implementation of the fabrication method described above. It will be noted that each via 80 and the associated pad 34 can be made of the same material and thus together form the same element. FIG. 13 shows a schematic cross-section of a smart card 82 according to a second embodiment of a card of the invention. This card includes the connector 78 described in FIGS. 10 and 11 and is obtained via the second implementation of the fabrication method described above. Contact pads 8 may be defined by the bottom surfaces of vias 80. Thus, in the cards of FIGS. 12 and 13 obtained with a connector according to the first embodiment described above, the plurality of external metal contact pads 4 is respectively electrically connected to the plurality of internal metal contact pads 20 by a plurality of metal parts 18+34+80, respectively 18,62+8+80, which are each at least partially formed by a solder material and which traverse insulating support 6 through apertures respectively provided in the insulating support. Smart card 82, 84 according to the invention is characterized in that the plurality of metal parts is respectively covered by the plurality of external metal contact pads 4, which close the apertures on the external face of insulating support 6. The plurality of metal parts respectively forms connecting bridges between the rear surfaces of the plurality of external metal contact pads 4 and the plurality of internal metal contact pads 20. In addition to the aforementioned variants for obtaining thick contact pads 34 and for making solders between internal contact pads of the connector and corresponding contact pads arranged at the surface of the cavity forming a housing for the connector, various advantageous embodiments and specific variants of the present invention will be described below.

Figure 14:
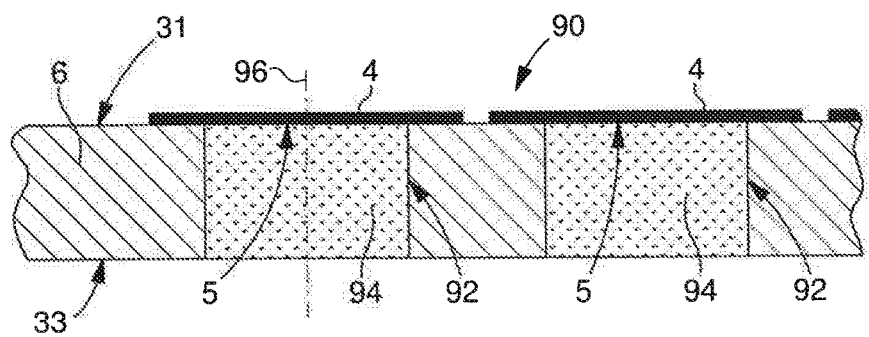
FIG. 14 is a partial cross-section of a second embodiment of a connector according to the invention.

FIG. 14 shows a second embodiment of a connector 90 according to the invention. Insulating support 6 has apertures 92 which are closed on external face 31 by external metal contact pads 4. Each aperture 92 is filled with a solder paste 94 to substantially the level of internal face 33 of the insulating support. The solder paste is deposited on the rear surface 5 of pads 4. The apertures have a central axis 96 perpendicular to external face 31 and thus to the plane defined by pads 4. Pads 4 are preferably made with a film or metal sheet (particularly copper) deposited on external face 33 of support 6. The pads have some rigidity, which is sufficient for them to remain flat above the apertures of the insulating support, also when heat is supplied for soldering. It is to be noted that only one or two external pad(s) are shown completely in FIG. 14 and in the following Figures, but the connector may have several external contact pads, particularly two rows of three or four pads.

Figure 15:
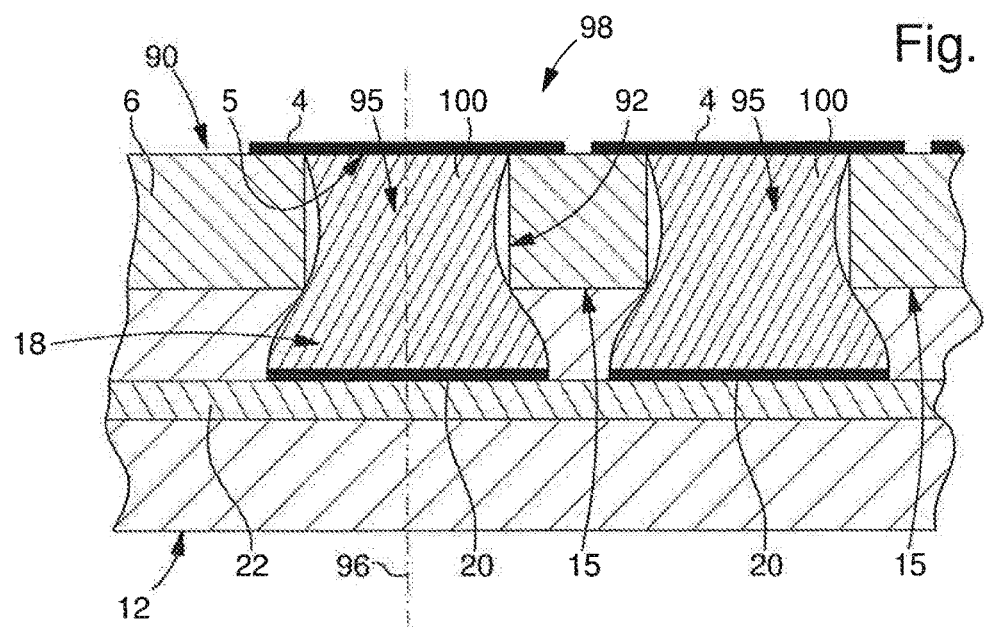
FIG. 15 is a partial cross-section of a third embodiment of a smart card according to the invention.

FIG. 15 shows a third embodiment of a card 98 according to the invention. This card has a card body 12 of the type described above which includes internal metal contact pads 20 generally arranged on an insulating support 22. The cavity in this card body houses connector 90, with no adhesive film between the connector and the cavity surface 15. Internal pads 20 are arranged underneath said external connector and respectively aligned with external pads 4 in direction 96 perpendicular to external face 31. During fabrication of card 98, as explained above, heat is supplied locally to external pads 4 to make a soldered connection. This heat is directly transmitted to solder paste 94, which is placed on rear surface 5 of the external pads. With a controlled heat supply, the solder material in each aperture 92 melts and the heat easily passes through the solder material to reach solder bump 18, located opposite the corresponding aperture 92 and deposited on internal pad 20. Solder material 18 melts at least at the surface and is joined to melted solder material 94, which, after cooling, forms a solder 95 with a slightly smaller volume due to contraction. Small spaces therefore appear between solder 95 and the lateral surface of apertures 92, as shown schematically in FIG. 15. In the end, card 98 has a plurality of external pads 4 respectively electrically connected to a plurality of internal pads 20 by a plurality of metal parts 100, which are each at least partially formed by a solder and which traverse insulating support 6 through respective apertures 92 provided in the insulating support. In the variant shown, metal parts 100 are entirely formed of solder material.

Figure 16:
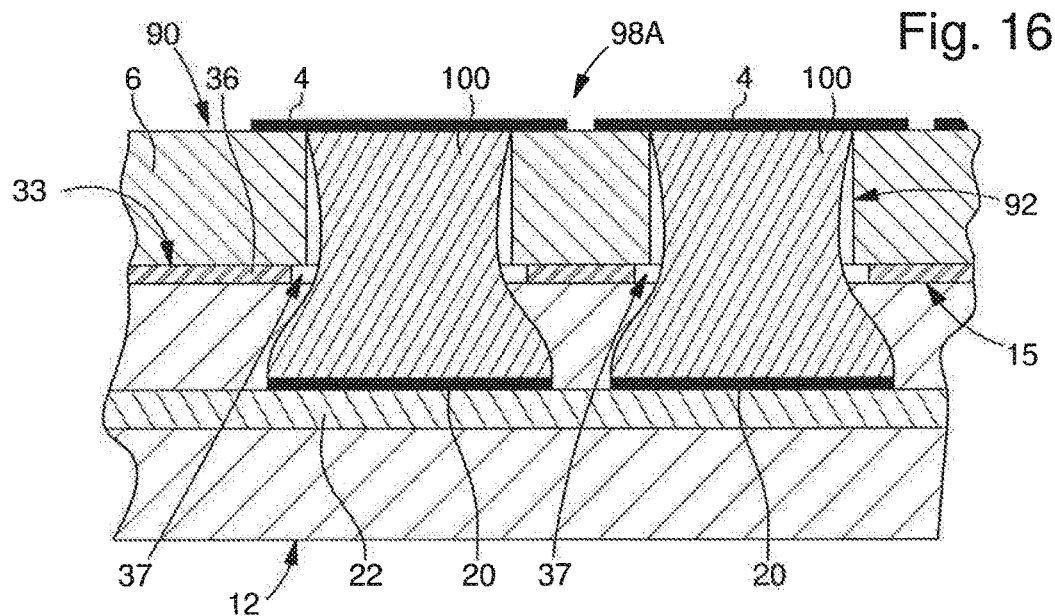
FIG. 16 is a partial cross-section of a fourth embodiment of a smart card according to the invention.

FIG. 16 shows a smart card 98A according to a fourth embodiment of the invention. This card differs from that of FIG. 15 in that, in addition to being soldered to the card body, the connector is bonded to surface 15 of the cavity in which it is housed. By using the connector as shown in FIG. 14, it is clear that there is a shortage of solder material in apertures 37 of the adhesive film 36 used. However, when solder material 94 melts it flows towards solder material 18 and the solder then also traverses the apertures in the adhesive film. It is to be noted that other connectors according to the invention described below may advantageously be used.

In all the drawings of cards of the invention, solder bumps 18 are deposited on internal pads 20. These bumps are inside the card body and generally have a truncated top surface when the cavity is machined, which initially define intermediate contact pads. However, these cards of the present invention are not limited to this arrangement. Indeed, in other variants (not shown), internal pads 20 may each be flush with a surface of the card body cavity and the solder is preferably made with the solder material contained in the connector underneath its external pads. It is also to be noted that, in other fabrication variants, the solder material may be deposited before the connector is added, on the internal pads when they are visible in the cavity or otherwise on solder bumps 18. It is clear that the connector apertures 92 may be partially filled with solder material, or be empty when the connector is placed in the cavity. The solder material deposited on the visible pads in the cavity then at least partially fills the insulating support apertures. The amount of braze supplied is such that the solder material in the apertures is in contact with the rear surface of external pads 4. A card according to the invention can thus also be obtained after soldering.

Figure 17:
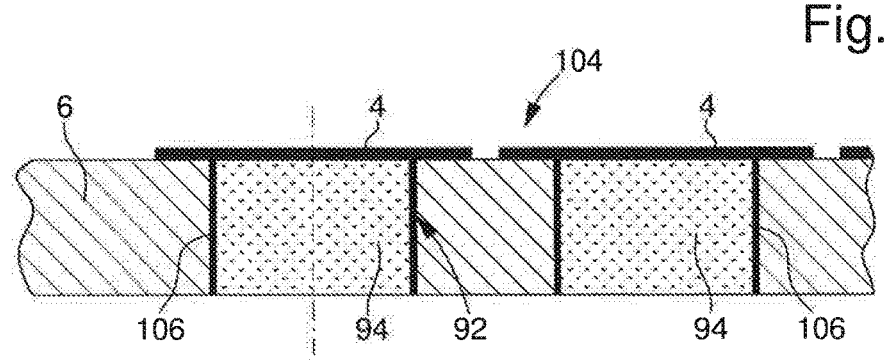
FIG. 17 is a partial cross-section of a third embodiment of a connector according to the invention.
Figure 18:
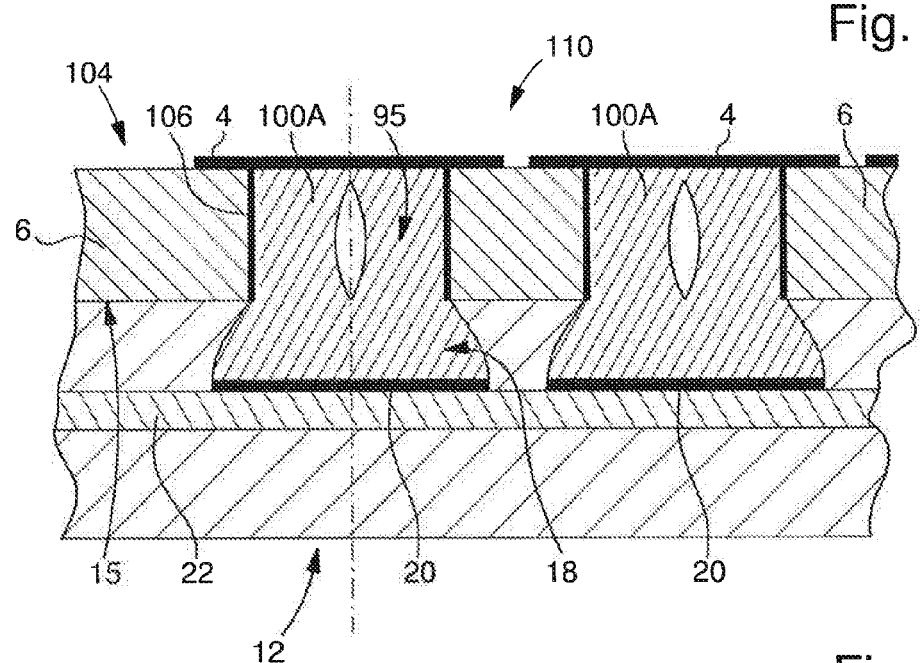
FIG. 18 is a partial cross-section of a variant of the third smart card embodiment.

FIG. 17 shows a connector 104 according to a third embodiment of the invention. It differs from that of FIG. 14 in that the lateral wall of apertures 92 is coated with a metallic layer 106 which adheres properly to the lateral wall. This layer 106 defines an anchorage layer for the molten solder paste 94. It advantageously includes a top gold flash, which also preferably covers the rear surface of the external contact pads. Thus, when the soldering is performed, the molten solder 95 is easily joined to this metallic layer and to the rear face of the external pads. Metallic parts 100A are thus obtained with air and/or a residual binding agent preferably located inside the metallic parts, as shown schematically in FIG. 18 which is a variant of the third embodiment of a card 110 according to the invention.

Figure 19:
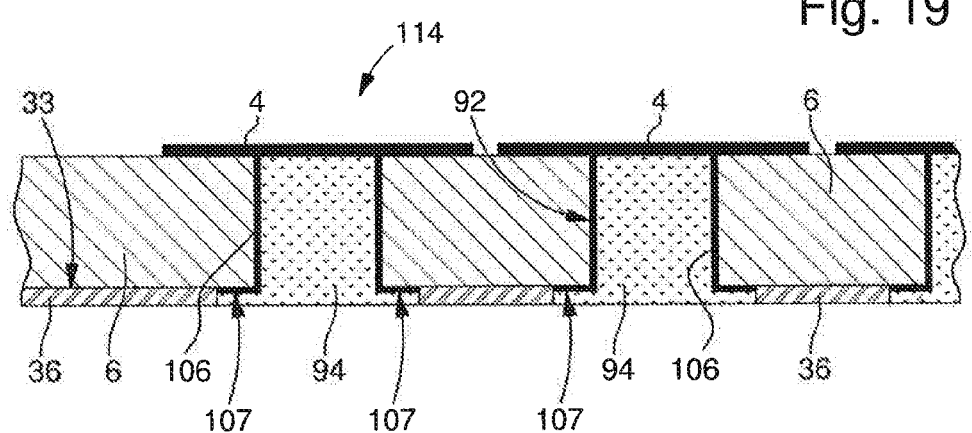
FIG. 19 is a partial cross-section of a fourth embodiment of a connector according to the invention.
Figure 20:
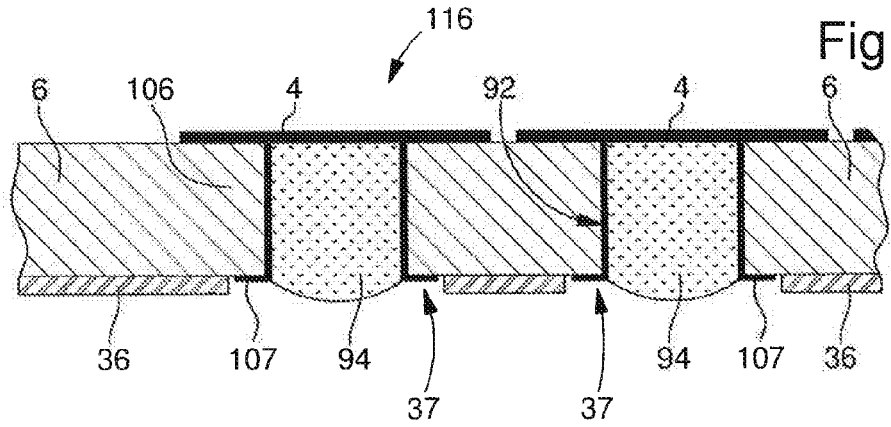
FIG. 20 is a first variant of the fourth connector embodiment.
Figure 21:
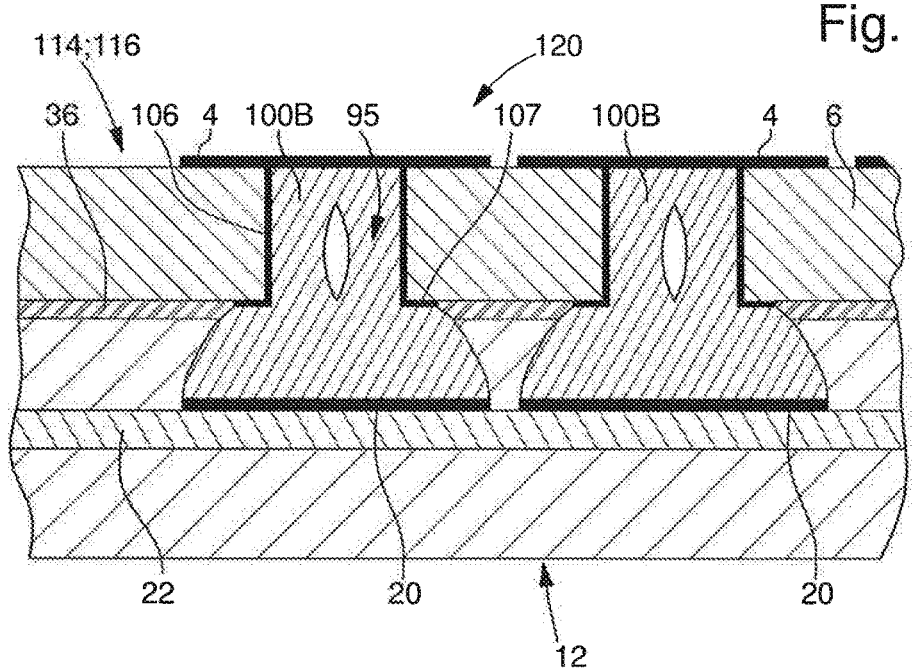
FIG. 21 is a variant of the fourth smart card embodiment.

FIG. 19 shows a connector 114 according to a fourth embodiment. It differs in that the plating 106 is extended at the periphery of each aperture 92 via a metallic layer 107 of the same material. Since holes 92 are normally circular, layer 107 generally defines an annular contact pad. An adhesive film 36 is applied against the internal face 33 of the insulating support. It has apertures each aligned on the corresponding apertures of support 6 with a diameter which substantially matches the external diameter of layer 107. As in the case of the second fabrication variant described above, solder material 94 not only fills apertures 92 but also the apertures in the adhesive film. An excess of solder material can be provided here which is then removed with a blade, as shown in FIG. 8C. It is to be noted that connectors 90, 104 and 114 described above may advantageously be placed in a furnace to dry the solder paste before the connectors are assembled to the card body. FIG. 20 shows a first variant wherein solder material 94 is provided using a dispenser device which deposits a precise amount, greater than the volume of aperture 92, in each aperture 92 of connector 116, so as to at least partially fill the corresponding aperture in the adhesive film when the connector is inserted into the card body cavity and preferably to cover annular contact pad 107. Note that in this case, the adhesive film may be placed separately from the connector in the corresponding cavity in the card body. Once connector 114 or 116 is inserted into the cavity and heat is supplied to perform the solder, a card 120 is obtained as shown schematically in FIG. 21. This card has a metallic part 100B between external pads 4 and internal pads 20 which essentially matches the shape defined by apertures 92 and 37 (FIG. 20).

Figure 22:
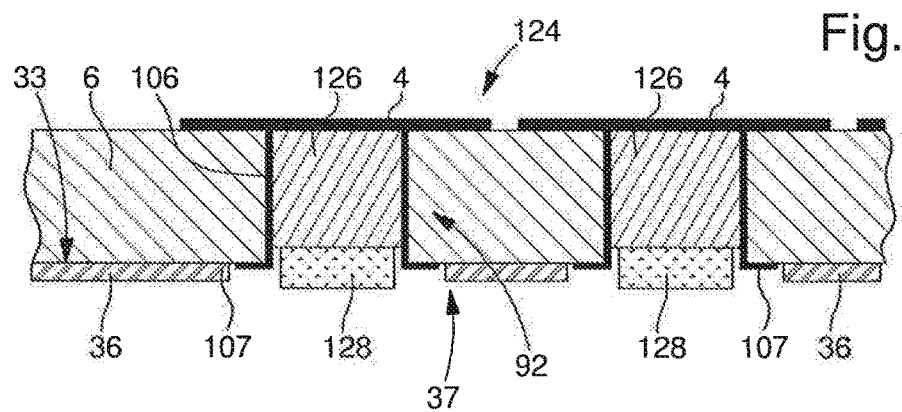
FIG. 22 is a second variant of the fourth connector embodiment.

FIG. 22 shows a schematic view of a connector 124 which defines a second variant of connector 114. This connector differs in that the solder material placed in apertures 92 takes two forms: a first part 126 in compact metal form, i.e. molten and hardened, and a second part 128 in paste form. In the example shown, a solder paste is first of all inserted into apertures 92. Then, the connectors are placed in a furnace and the paste melts and contracts so that solder 126 does not fill apertures 92. A solder paste 128 is then added by a screen printing technique in sufficient thickness for the paste to reach at least the external surface of adhesive film 36. As in the case of FIG. 19, a small excess thickness is advantageously provided to fill aperture 37 as far as possible when the connector is placed in a housing during fabrication of the card of the invention and to ensure that there is contact between the solder paste and a contact pad flush with a bottom surface of the housing even before the solder paste melts.

Figure 23A:
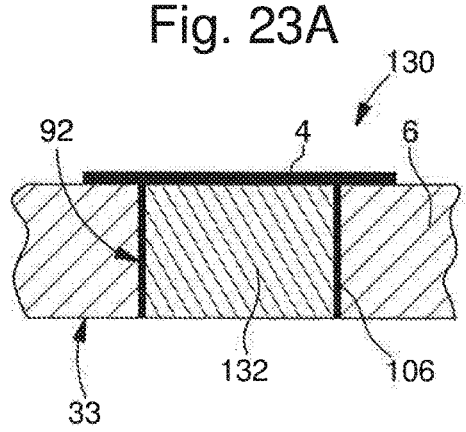
FIGS. 23A and 23B shows two variants of the third connector embodiment.
Figure 23B:
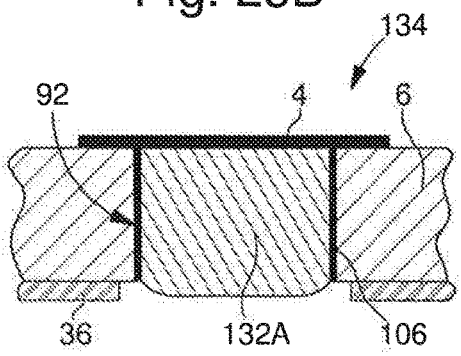

FIGS. 23A, 23B respectively show two variants of the third connector embodiment. These variants may also be used for the second or fourth embodiments. They differ essentially in that apertures 92 are filled with solder material 132 in the form of compact metal, i.e. a solder that has been melted to fill these apertures and then hardened on cooling. The solder paste may either be added and then melted, or a dispensing device can be used to add liquid solder which then hardens in the apertures. The latter case requires a more complex device. Where solder paste is used, it is possible to have two filling steps for filling apertures 92, in each of which a solder paste is deposited in the apertures and then melted. Connector 130 has apertures 92 filled with solder material substantially to the level of internal face 33, whereas connector 134 has solder bumps 132 whose top surface is almost at the external surface level of adhesive film 36. The film may be pre-bonded onto internal face 33 of the connector after solder bump 132A is formed, or it may be placed in the card body cavity prior to or simultaneously with the positioning of the connector. Solder bumps 132 and 132A define metallic vias of relatively large diameter. The diameter is more than 200 microns, and preferably more than 500 microns. The height of these bumps varies according to the thickness of insulating support 6, for example between 150 and 250 microns. Unlike a conventional electrical via which is of small diameter (generally around 100 microns or less), or empty in the central part thereof if the diameter increases, the bumps or vias according to the invention have a relatively large diameter and are solid, since most of the apertures in the insulating support are filled with metal.

FIGS. 24A and 24B show two variants of a fifth embodiment of a particularly advantageous connector. This embodiment is similar to the fourth embodiment described above, but differs therefrom in that the peripheral metallic layer 107A has a relatively large thickness, which is substantially equal to or more than 30 microns (30 µm), for example between 30 and 70 microns, and preferably substantially equal to the thickness of the adhesive layer where provided. The thin metallic layers of FIGS. 19 and 20 may be vacuum deposited by various technologies known to those skilled in the art. In particular, they may include several sub-layers to improve the interface adhesive function. The thick metallic layers are preferably formed by a first deposition of at least one thin layer by a vacuum deposition method, for example by evaporation, then by a galvanic deposition to easily obtain the desired thickness. A final gold flash may be provided. In such case, layer 106A covering the lateral wall of apertures 92 is also relatively thick although it may be thinner. The rear surfaces of the external pads forming the apertures are generally also covered by a layer of the same type. Connector 136 has the blind holes defined by metallic layer 106A+107A filled with solder paste 94 up to substantially the level of the peripheral layer 107A, whereas connector 140 has blind holes filled with a solder material 132.

FIG. 25 shows a fifth embodiment of a card according to the invention. This card 144 is formed of a card body 12 and the connector 140 of FIG. 24B. No adhesive film is provided here. The solders made on each external pad serve to establish a reliable electrical connection and to secure the connector inside the cavity. The metallic part 100C is entirely solid and compact. In a variant, connector 136 of FIG. 24A is used. FIG. 26 shows a sixth embodiment of a card according to the invention. This card 148 is formed of a card body 12 and the connector 136 of FIG. 24A. As explained above, as it melts, the solder paste contracts slightly leaving at least one air or binding agent space in the metallic part 100D obtained. In this case, an adhesive layer 36 of substantially equal thickness to that of peripheral pads 107A is arranged between the insulating support and the bottom of the cavity. In a variant connector 140 is used.

It is to be noted finally that the technique of the invention for obtaining external contact pads on an external connector soldered to the internal contact pads of a card body may also be used to make additional solder points between the connector and the card body with no electrical function, so as to improve the securing of the connector to the card body and in particular to omit the use of an adhesive film.

The invention claimed is:

1. A smart card, comprising:
   an external connector including an insulating support, which defines an external face and an internal face opposite each other, and a plurality of external metal contact pads disposed on the external face of the insulating support;
   a card body having a recess in which the external connector is disposed; and
   an electronic unit and/or an antenna incorporated in the card body and electrically connected to a plurality of internal metal contact pads disposed in the card body underneath the external connector or on a surface of the recess and which are respectively aligned with the plurality of external metal contact pads in a perpendicular direction to the external face,
   the plurality of external metal contact pads being respectively electrically connected to the plurality of internal metal contact pads by a plurality of metal parts, which are each formed at least partially by a solder and which traverse the insulating support through a plurality of respective apertures in the insulating support,
   wherein the plurality of metal parts are respectively covered by the plurality of external metal contact pads, which close the plurality of insulating support apertures on a side of an external face thereof,
   wherein the insulating support apertures have a diameter of more than 0.2 mm, and
   wherein most of each aperture of the plurality of insulating support apertures is filled with a metal forming the plurality of metal parts, the plurality of metal parts respectively forming connecting bridges between rear surfaces of the plurality of external metal contact pads and the plurality of internal metal contact pads.

2. The smart card according to claim 1, wherein the diameter of the metal parts in the insulating support apertures is sufficiently large to channel enough heat through the insulating support, when the smart card is fabricated, to melt the solder located on or below an inner surface of the insulating support and thus to solder the connector to the plurality of internal metal contact pads.

3. The smart card according to claim 1, wherein the plurality of insulating support apertures each have a diameter of more than 0.5 mm.

4. The smart card according to claim 3, wherein the plurality of apertures are substantially entirely filled with the metal at least most of which is formed by the solder.

5. The smart card according to claim 4, wherein a lateral wall of the plurality of insulating support apertures is coated with a metallic layer forming an adhesive interface for the solder disposed in the apertures.

6. The smart card according to claim 1, wherein peripheral metal pads respectively surrounding the apertures of the plurality of insulating support apertures are disposed on the internal face of the insulating support.

7. The smart card according to claim 1, wherein an adhesive film, having apertures respectively aligned with the apertures of the plurality of insulating support apertures, is disposed between the internal face of the insulating support and a surface of the recess opposite the internal face.

8. The smart card according to claim 1, wherein the metal parts each include a thick contact pad that includes a thickness in a range of 30 to 80 microns.

9. An external connector configured to be housed in a cavity of a smart card comprising in a body of the card an electronic unit and/or an antenna, the connector comprising:
    an insulating support, having an external face and an internal face opposite each other and a plurality of apertures, and a plurality of external metal contact pads disposed on the external face of the insulating support,
    wherein the plurality of insulating support apertures is respectively covered by the plurality of external metal contacts, which close the apertures on a side of the external face of the insulating support,
    wherein the plurality of apertures each have a diameter of more than 0.2 mm, and
    wherein the plurality of apertures are substantially filled with a metal, at least a part of which is formed of a solder material.

10. The external connector according to claim 9, wherein the solder material is at least partially in a paste form.

11. The external connector according to claim 9, wherein the solder material is at least partially formed by a solid metal.

12. The external connector according to claim 9, wherein a lateral wall of the plurality of insulating support apertures is covered with a metallic film forming an adhesive interface for the solder material located in the apertures.

13. The external connector according to claim 9, further comprising peripheral metal pads respectively surrounding the apertures of the plurality of insulating support apertures.

14. The external connector according to claim 13, wherein a thickness of the peripheral metal pads is substantially equal to or greater than 30 µm.

15. The external connector according to claim 9, wherein an adhesive film, having apertures respectively aligned with the apertures of the plurality of insulating support apertures, is deposited against the internal face of the insulating support.

16. The external connector according to claim 15, wherein a diameter of the apertures in the adhesive film is greater than that of the plurality of apertures in the insulating support.

17. An external connector configured to be housed in a cavity of a smart card comprising in a body of the card an electronic unit and/or an antenna the connector comprising:
    an insulating support, having an external face and an internal face opposite each other and a plurality of apertures, and a plurality of external metal contact pads disposed on the external face of the insulating support,
    wherein the plurality of insulating support apertures is respectively covered by the plurality of external metal contacts, which close the apertures on a side of the external face of the insulating support,
    wherein the plurality of apertures each have a diameter of more than 0.2 mm,
    wherein the plurality of apertures are substantially filled with a metal,
    wherein an adhesive film, having apertures respectively aligned with the apertures of the plurality of insulating support apertures, is deposited against the internal face of the insulating support, and
    wherein a solder material is provided above the metal located in each aperture of the plurality of insulating support apertures in such a manner that a volume of the solder material is equal to or less than a volume of the corresponding aperture in the adhesive film.

18. A smart card comprising the external connector according to claim 17.

* * * * *